US007888959B2

(12) United States Patent
Cannon et al.

(10) Patent No.: US 7,888,959 B2
(45) Date of Patent: Feb. 15, 2011

(54) APPARATUS AND METHOD FOR HARDENING LATCHES IN SOI CMOS DEVICES

(75) Inventors: Ethan H. Cannon, Essex Junction, VT (US); AJ KleinOsowski, Austin, TX (US); K. Paul Muller, Wappingers Falls, NY (US); Tak H. Ning, Yorktown Heights, NY (US); Philip J. Oldiges, LaGrangeville, NY (US); Leon J. Sigal, Monsey, NY (US); James D. Warnock, Somers, NY (US); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 506 days.

(21) Appl. No.: 11/857,596

(22) Filed: Sep. 19, 2007

(65) Prior Publication Data
US 2009/0134925 A1 May 28, 2009

(51) Int. Cl.
*G01R 31/26* (2006.01)
(52) U.S. Cl. ........................ 324/762.01; 326/9
(58) Field of Classification Search .......... 327/112, 327/211, 199; 326/9, 13, 27; 324/762, 754, 324/765
See application file for complete search history.

(56) References Cited

U.S. PATENT DOCUMENTS

| 5,175,605 | A  | * | 12/1992 | Pavlu et al. ............ 257/369 |
| 5,307,142 | A  | * | 4/1994  | Corbett et al. ......... 365/156 |
| 6,278,287 | B1 | * | 8/2001  | Baze .................... 326/9 |
| 6,327,176 | B1 | * | 12/2001 | Li et al. ................. 365/156 |
| 6,608,512 | B2 | * | 8/2003  | Ta et al. ................. 327/211 |
| 6,703,870 | B2 | * | 3/2004  | Chung et al. ........... 327/51 |
| 6,794,908 | B2 | * | 9/2004  | Erstad .................. 327/112 |
| 6,804,502 | B2 |   | 10/2004 | Burgener et al. |
| 6,963,217 | B2 | * | 11/2005 | Samudrala et al. ...... 326/11 |
| 7,161,404 | B2 | * | 1/2007  | Hazucha et al. ........ 327/203 |

(Continued)

FOREIGN PATENT DOCUMENTS

JP          10093023 A        4/1998

OTHER PUBLICATIONS

Makihara, A. et al; "SEE in a 0.15 μm Fully Depleted CMOS/SOI Commercial Process"; IEEE Transactions on Nuclear Science; vol. 51; No. 6; Dec. 2004.

(Continued)

*Primary Examiner*—Ha Tran T Nguyen
*Assistant Examiner*—Richard Isla Rodas
(74) *Attorney, Agent, or Firm*—Scott Paul, Esq.; Carey Rodriguez Greenberg Paul, LLP (57) ABSTRACT

A method of determining one or more transistors within a particular circuit to be respectively replaced with a hardened transistor includes: identifying, as not requiring hardening, one or more transistors; identifying, as candidates for hardening, each transistor in the circuit not previously identified as not requiring hardening; and employing the hardened transistor in place of a transistor identified as a candidate for hardening. The circuit is a latch and the transistor is an SOI CMOS FET. The transistor is also an SOI transistor. The series transistor includes first and second series-connected transistors having a shared source/drain region whereby a drain of the first series-connected transistor is merged with a source of the second series-connected transistor.

4 Claims, 6 Drawing Sheets

U.S. PATENT DOCUMENTS

| | | | |
|---|---|---|---|
| 7,236,001 B2 * | 6/2007 | Fulkerson | 326/12 |
| 7,298,010 B1 * | 11/2007 | Ma | 257/359 |
| 7,332,780 B2 | 2/2008 | Matsuda et al. | |
| 7,362,154 B2 * | 4/2008 | Mo | 327/203 |
| 7,679,403 B2 * | 3/2010 | Erstad | 326/95 |
| 2003/0214773 A1 | 11/2003 | Kitagawa | |
| 2004/0007743 A1 * | 1/2004 | Matsuda et al. | 257/369 |
| 2004/0130351 A1 * | 7/2004 | Hazucha et al. | 327/15 |
| 2004/0140483 A1 | 7/2004 | Yonemaru | |
| 2006/0001045 A1 | 1/2006 | Sidhu et al. | |
| 2006/0187700 A1 * | 8/2006 | Ho | 365/145 |

OTHER PUBLICATIONS

Makihara, A. et al; "Hardness-by-Design Approach for 0.15 µm Fully Depleted CMOS/SOI Digital Logic Devices with Enhanced SEU/SET Immunity"; IEEE Transactions on Nuclear Science; vol. 52; No. 6; Dec. 2005.

Makihara, A. et al; "Optimization for SEU/SET Immunity on 0.15 µm Fully Depleted CMOS/SOI Digital Logic Devices"; IEEE Transactions on Nuclear Science; vol. 53; No. 6; Dec. 2006.

* cited by examiner

APPARATUS AND METHOD FOR HARDENING LATCHES IN SOI CMOS DEVICES

STATEMENT REGARDING FEDERAL SPONSORED RESEARCH OR DEVELOPMENT

This invention was made with Government support under Contract No. hr0011-07-9-0002 awards by DARPA (Defense Advanced Research Projects Agency). The Government has certain rights in this invention.

CROSS-REFERENCE TO RELATED APPLICATIONS

This application is related to U.S. application Ser. No. 11/857,569 filed on Sep. 19, 2007, entitled HARDENED TRANSISTORS IN SOI DEVICES, incorporated herein by reference in its entirety.

BACKGROUND OF THE INVENTION

1. Field of the Invention

The disclosure relates generally to transistor devices and, more specifically, to a method and apparatus for hardening latches.

2. Description of the Related Art

Complementary Metal-Oxide-Semiconductor (CMOS) circuits are susceptible to high-energy particles. Upon a CMOS device, such as an Silicon-On-Insulator (SOI) transistor, being biased in the OFF state and a high-energy particle, e.g., an alpha particle, being incident in the device channel or body region, the high-energy particle can generate a large number of electron-hole pairs, causing a large transient current to flow between the source and the drain. This large transient current causes a device, which is biased in the OFF (or non-conducting state) to become momentarily conducting, and this conduction can momentary turn the transistor ON, which can cause an error to occur in the CMOS circuit. This is often called a soft-error or Single-Event Upset (SEU). These types of soft errors are a major reliability concern in modern circuits. Unless storage elements are protected, soft errors can cause unrecoverable loss of data and system crashes. Various sources of high energy particles, which lead to soft errors, include impurities in packaging materials, impurities present in back of the line interconnect, and cosmic rays.

Figure 1:
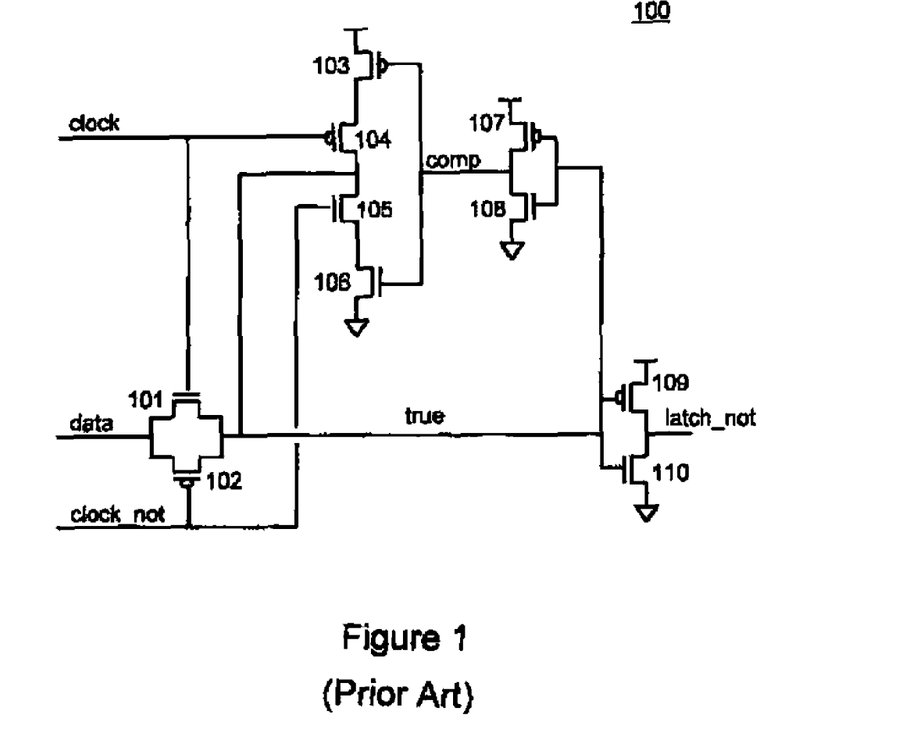
FIG. 1 is a typical conventional latch.

FIG. 1 illustrates a conventional latch 100. The logic states of "clock" and "clock_not" are opposite of each other. Upon "clock"=1, Field Effect Transistors (FETs) 101, 102 are ON while FETs 104/105 are OFF. The latch 100 is written such that "true"←"data." Upon "clock"=0, FETs 101, 102 are OFF while FETs 104, 105 are ON. The latch 100 maintains its state via a pair of cross-coupled inverters formed by FETs 107, 108 and FETs 103, 106. The inverter formed by FETs 109, 110 drives external circuits. Assuming an initial state of "true"=0, FET 108 is OFF and FET 107 is ON while "comp"=1. The "comp"=1 drives FET 106 to ON and FET 103 to OFF.

Upon a high energy particle hitting, for example, the body of FET 108, which is in the OFF state, the higher energy particle raises the drain to source current such that FET 108 turns ON and node "comp" is pulled low to 0. The inverter formed by FETs 103, 106 reacts and drives its output node of "true" to a high value and the prior 0 state of node "true" is lost. Thus, the result from the impact of high energy particle is a loss of stored data.

Many different techniques have been employed to harden these circuits against soft errors. Techniques to address these soft errors include physically shielding the entire device from radiation. Logical techniques have also been employed to address SEU. For example, at a register level, parity bits are added to stored data and error correction codes are used to check for corrupted data. At the latch level, in which only a single bit of information is stored, three latches can be used to represent the same data and a 1 out of 3 majority circuit is used to read the data (i.e., ab+ac+bc). At the transistor level, redundant transistors/storage nodes may be employed and compared against one another. These techniques, however, can be expensive, in area on a chip, delay and/or power consumption, to employ. There is, therefore, a need for an improved circuit design that reduces SEU while subjecting the design to reduced overhead in area, delay, and power consumption.

BRIEF SUMMARY OF THE INVENTION

Embodiments of the invention provide a novel and non-obvious method and configuration for reducing SEU. The method of determining one or more transistors within a particular circuit to be respectively replaced with a hardened transistor includes: identifying, as not requiring hardening, one or more transistors; identifying, as candidates for hardening, each transistor in the circuit not previously identified as not requiring hardening; and employing the hardened transistor in place of a transistor identified as a candidate for hardening. The circuit is a latch and the transistor is an SOI CMOS FET. The hardened transistor includes first and second series-connected transistors having a shared source/drain region whereby a drain of the first series-connected transistor is merged with a source of the second series-connected transistor. In certain instances, hardened, series transistors are employed for all of the candidates for hardening.

In another embodiment of the invention, a method of determining one or more transistors within a particular latch to be respectively replaced with a hardened, series transistor is disclosed. The method identifies each storage node; identifies, as not requiring hardening, each transistor having only a gate terminal connected to a storage node of the latch; and identifies, as not requiring hardening, each transistor that remains ON upon both of (i) the latch holding its state, and a respective storage node at logic state 0, and (ii) the latch holding its state, and the respective storage node at logic state 1. Each transistor not previously identified as not requiring hardening are then identified as a candidate for hardening. A hardened, series transistor is employed in place of a transistor identified as a candidate for hardening. In certain aspects, the candidates for hardening only include transistors being part of a cross-coupled inverter of the latch. Also, the threshold voltage of the hardened transistor may be lower than a threshold voltage of a transistor being replaced by the hardened transistor.

In yet another embodiment of the invention, a circuit includes at least one hardened, series transistor, and at least one non-hardened transistor. In certain aspects, the circuit is a latch, and the at least one non-hardened transistor includes one or more transistors having only a gate terminal connected to a storage node of the latch. Also, the at least one non-hardened transistor includes one or more transistors that remain ON upon both of (i) the latch holding its state, and a respective storage node at logic state 0, and (ii) the latch holding its state, and the respective storage node at logic state 1. The candidates for hardening may also only include transistors that are part of a cross-coupled inverter of the latch. The circuit may further include a multiplexer circuit, and the at least one non-hardened transistor includes a transistor in the latch that is directly connected to a data node, which is directly connected to the multiplexer circuit.

In other aspects, the at least one non-hardened transistor includes a transistor always driven ON during a default state of the latch. Also, a hardened, series transistor may be located in all SEU-susceptible transistor nodes of the circuit. The circuit may include a master latch and a slave latch, and the at least one non-hardened transistor includes a transistor in the slave latch that is directly connected to a data node, which is directly connected to the master latch. The transistor may be an SOI device, and the hardened, series transistor includes first and second series-connected transistors having a shared source/drain region whereby a drain of the first series-connected transistor is merged with a source of the second series-connected transistor.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE INVENTION

Figure 2:
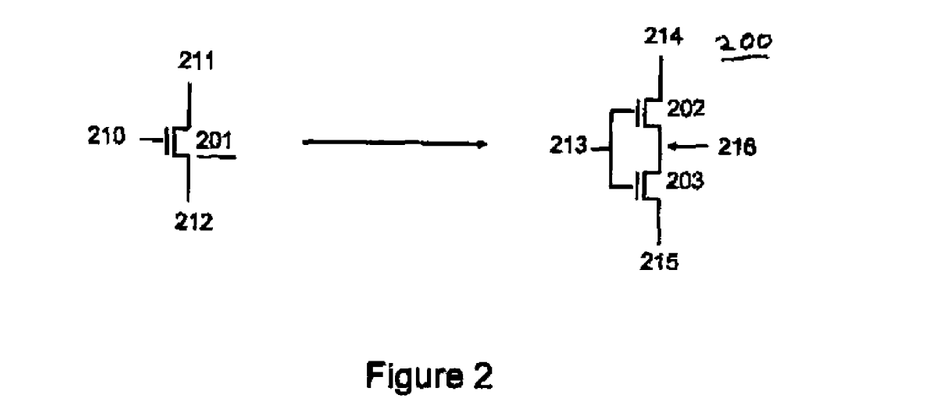
FIG. 2 illustrates a conventional FET being replaced by a SEU-hardened, series FET in accordance with the inventive arrangements.

Referring to FIG. 2, a SEU-hardened series FET is disclosed. As discussed herein, certain SEU-susceptible FETs are replaced with SEU-hardened FETs. An nFET 201 includes a gate terminal 210, drain terminal 211, and source terminal 212. To SEU-harden this FET, the nFET 201 is replaced by two series-connected nFETs 202, 203, collectively referred to as series nFET 200. Although described with regard to an nFET, one skilled in the art would recognize that a similar replacement can be performed using a pFET.

The two nFETs 202, 203 are connected in series such that the drain terminal of the first nFET 203 is connected to the source terminal of the second nFET 202 at node 216. Also, the respective gate terminals of the two nFETs are connected together at node 213. The series nFET 200 is used in the original circuit in place of nFET 201. In so doing, node 213 of the series nFET 200 connects where node 210 was, node 214 (i.e., the drain terminal of nFET 202) of the series nFET 200 connects where node 211 was, and node 215 (i.e., the source terminal of nFET 203) of series nFET 200 connects where node 212 was.

As the term is used herein, "hardened, series transistor" refers to at least two transistors having a shared gate terminal (either physically shared or in which the gate terminals of the transistors are directly, electrically connected) and in which a source of first one of the transistors is shared within a drain of a second one of the transistors (either physically shared or in which the drain is directly, electrically connected to the source). Other terms used herein that also refer to this structure includes "SEU-hardened, series transistors," "hardened FET," and "series FET." The term "non-series transistor" (and variations thereof) refers to a transistor that is not a hardened, series transistor, as defined above, or part of a series transistor.

Upon the replacement being made, when the gate terminals (i.e., node 213) of the series nFET 200 are at 0, both nFETs 202, 203 are OFF. As such, even if one of the two nFETs 202, 203 experiences an event that would normally cause a SEU (e.g., by being hit by a high energy particle), which would cause the nFET to turn ON (e.g., nFET 202), the conduction path (i.e., from source 215 to drain 214) is blocked by the second transistor (e.g., nFET 203) which remains in the OFF state. In this manner, the latch state can be maintained despite the event.

Two important parameters of a transistor are on-current ($I_{on}$) and off-current ($I_{off}$). $I_{on}$ is the drain to source current ($I_{ds}$) that flows upon a gate to source voltage ($V_{gs}$) being greater than the threshold voltage ($V_t$). A higher $I_{on}$ translates to a faster switching speed of a transistor. $I_{off}$ is the drain to source current ($I_{ds}$) that flows when a gate to source voltage ($V_{gs}$) is less then the threshold voltage ($V_t$). A lower $I_{off}$ translates to a lower standby power of an OFF transistor.

Current technologies offer multi-threshold transistors which enable designers to better balance circuit power vs. speed. For example, as $V_t$ is lowered, both $I_{on}$ and $I_{off}$ increase but $I_{off}$ increases much faster. A typical regular-$V_t$ FET may have $I_{on}$=900 μA/μm at $I_{off}$=20 μA/μm, and a typical low-$V_t$ FET may have $I_{on}$=1000 μA/μm at $I_{off}$=100 μA/μm. Moreover, $I_{off}$ may be higher with both a higher $V_{gs}$ and a higher $V_{ds}$.

Reference is made to the FET 201 in FIG. 2 in the OFF state while assuming that the voltage at the gate terminal 210 ($V_g$)=0 Volt, voltage at the source terminal 212 ($V_s$)=0 Volt, and voltage at the drain terminal 211 ($V_d$)=1 Volt. The $I_{off}$ of FET 201 is determined by $V_{gs}$=0 Volt and $V_{ds}$=1 Volt. After FET 201 is replaced by series FET 200, the $I_{off}$ current may decrease by a significant factor (e.g., 20 times smaller). This reduction in the $I_{off}$ current is attributable to at least two factors.

With gate terminal 213 at 0 Volt, the node 216 has no conduction path to a supply, and the node 216 tends to float between a source terminal 215 voltage of 0 Volt and a drain terminal 214 voltage of 1 Volt. For example, node 216 can float to voltage of 0.1 Volt. This increase in the node 216 voltage tends to reverse bias the $V_{gs}$ voltage of FET 202 ($V_g$=0 Volt minus $V_s$=0.1 Volt→$V_{gs}$=−0.1 Volt), and as previously explained, a lower $V_{gs}$ reduces $I_{off}$.

In addition, the $V_{ds}$ across FET 202 is now $V_d$=1 Volt minus Vs=0.1 Volt→$V_{ds}$=0.9 Volt. Moreover, a lower $V_{ds}$ also reduces $I_{off}$. With a significantly reduced $I_{off}$ for the series FET 200, a designer has the option to replace regular-$V_t$ FETs with low-$V_t$ FETs. This configuration can still meet the original power leakage requirements of a single FET 201. However, the switching speed of the series FET 200 at a low $V_t$ will be faster than the switching speed of the series FET 200 at a regular $V_t$.

Alternatively, a designer can reduce the sizes of the low-$V_t$ series FETs versus. the sizes of the series FETs having a regular $V_t$. A smaller low-$V_t$ series FETs will still have a similar $I_{on}$ as a larger, regular-$V_t$ series FET, but the smaller low-$V_t$ series FETs will have a smaller footprint. It should be noted, however, that reducing the $V_t$ of the FETs 202, 203 connected in series in comparison to $V_t$ of original single FET 201 is not required.

Although in certain aspects of the series FET 200, FETs 202, 203 have the same design and/or the same transistor parameters. The FET 200 is not limited in this manner, as the FETs 202, 203 may have different designs and/or transistor parameters. For example, FETs 202, 203 may have the same design, the same gate insulator thickness, the same channel length or drain-to-source distance, the same p-type body region thickness and doping profile, and the same drain region doping profile.

Alternatively, FETs 202, 203 may have different designs, with FETs 202, 203 having different channel lengths, different p-type body region thicknesses and doping profiles, and/ or different drain region doping profiles. Moreover, the body region of FET 202 can be either electrically shorted to its source region or not electrically shorted to its source region. Similarly, the body region of FET 203 can either be electrically shorted to its source region or not electrically shorted to its source region. Furthermore, the body regions of FETs 202 and 203 can either be partially depleted (i.e., having a finite quasi-neutral body region) or fully depleted (i.e., having no quasi-neutral body region).

Figure 3A:
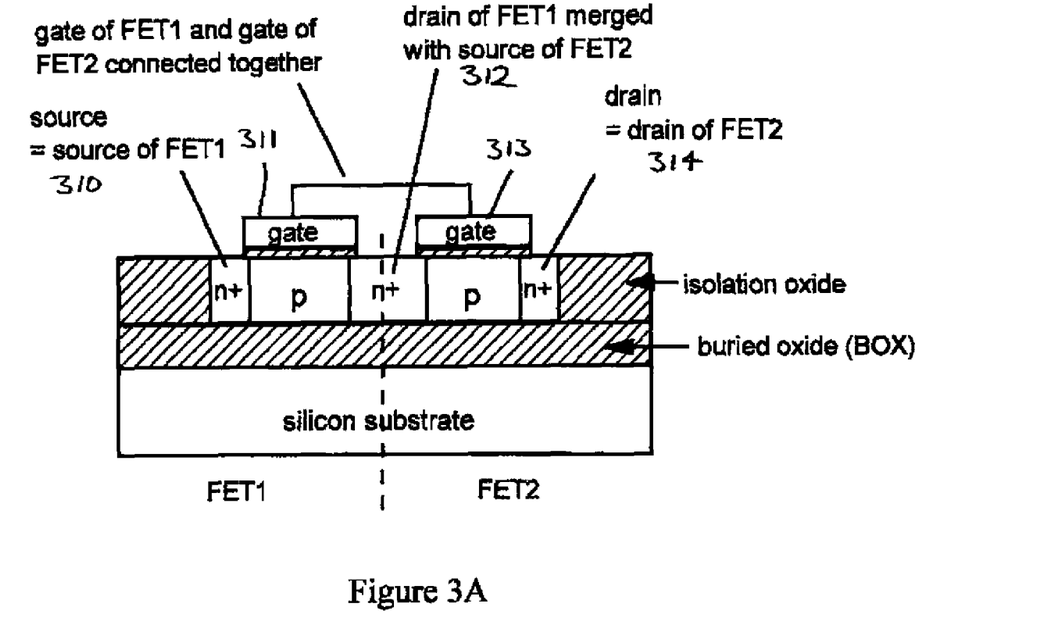
FIGS. 3A, 3B are cross-sectional views, respectively, of two embodiments of a series FET in accordance with the inventive arrangements.
Figure 3B:
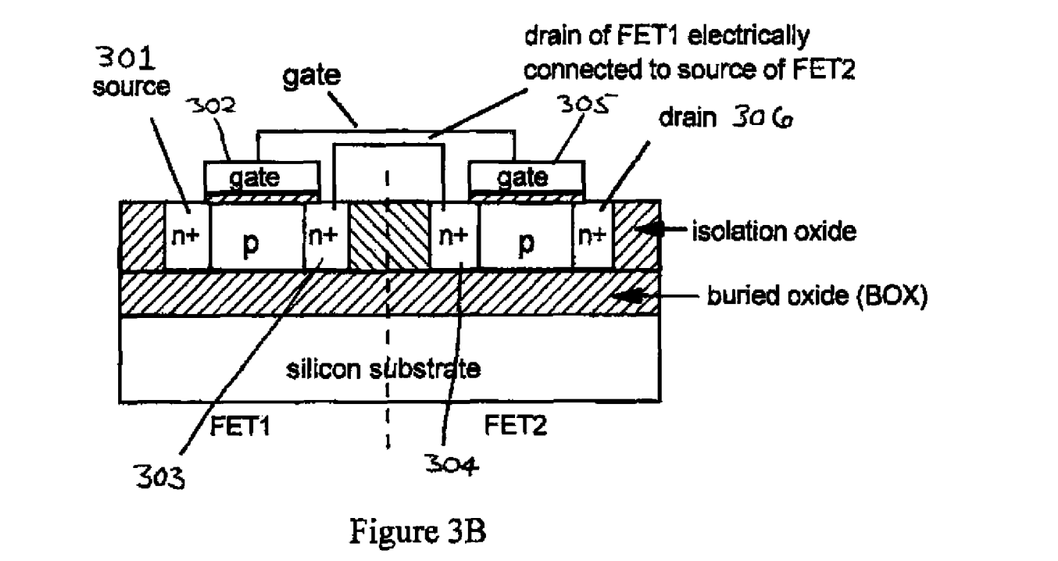

FIGS. 3A and 3B respectively illustrate two different configurations of the SEU-hardened, series FET. Referring to FIG. 3B, one configuration includes two separate FETs 302, 305. In so doing, the common node 216 illustrated in FIG. 2 is formed upon the drain terminal 303 of FET1 being connected to the source terminal 304 of FET2 via an external connection. Referring to FIG. 3A, another configuration includes two joined FETs 311, 313. Unlike the configuration of 3B, in this configuration, the common node 216 illustrated in FIG. 2 is merged into one shared structure 312, in which the drain of FET 1 is merged with the source of FET 2.

The configuration of FIG. 3A is particularly effective in devices having source/drain implants that reach all the way to a buried oxide (BOX). An example of a particular technology employing this configuration is Silicon-On-Insulator (SOI). In this configuration, the bodies of the two FETs 311, 313 are isolated from one other. As a result, the majority hole or electron carriers, which are generated after a high energy particle hits the transistor body of one of the constituent SOI FETs, cannot flow to the transistor body of the other constituent SOI FET in the series. Thus, a separation distance between the two FETs 311, 313 is not required. In certain aspects of the series FETs, the configuration employed in FIG. 3A is employed since, for example, this configuration reduces the area overhead of the series FET.

The most commonly used semiconductor material for forming SOI is silicon. However, any semiconductor material that is compatible with an SOI structure is acceptable for use with the present series FET. Other possible semiconductors materials include germanium, silicon-germanium alloy, and semiconductor materials that can be grown on top of silicon, such as germanium or silicon-germanium alloy.

Although the present series transistor has been described herein with reference to SOI CMOS technology, the SEU-hardened series transistor is not limited in this manner. Any transistor having either a current design or a future design with a structure upon which a high-energy particle hitting the transistor turns an OFF state into an ON state is acceptable for use with the techniques described herein. For example, a Fin-FET is a FET configuration that can benefit from the teachings described herein.

Although the described methods and apparatus may be employed to reduce the effects of SEU, the described methods and apparatus are not limited in this manner. These techniques may be employed to reduce the effect of any phenomenon that is capable of causing an OFF transistor to momentarily turn ON, for example, noise coupling. Additionally, these techniques may be employed to protect latches against certain types of hard defects (created, for example, during manufacturing) which cause a single transistor to always be in an ON state (e.g., a source-drain short). In such a circumstance, the defective transistor acts as a simple conductive line and the other transistor in the series transistor group will acts solely as the switch.

Additional aspects of the hardened, series transistor are described in related U.S. application Ser. No. 11/857,569, filed on Sep. 19, 2007, entitled HARDENED TRANSISTORS IN SOI DEVICES, incorporated herein by reference in its entirety.

In many instances, replacing each non-series FET within a particular circuit design with a series FET is not practicable or desirable. For example, upon a single FET being replaced by a series FETs, the overall design incurs overhead with regard to area, delay, and power consumption. For example, if a FET is replaced by two series FETs, the design gets larger from area point of view. Furthermore, the delay of two series FETs is slower then a single FET. Moreover, "clock" and "data" signals drive twice as much capacitance, which increases the power consumption of the circuit. Thus, in certain instances, a method can be employed to select certain transistors within a particular circuit to be replaced with SEU-hardened, series transistors. In so doing, the overhead with regard to area, delay, and power consumption can be reduced.

Figure 10:
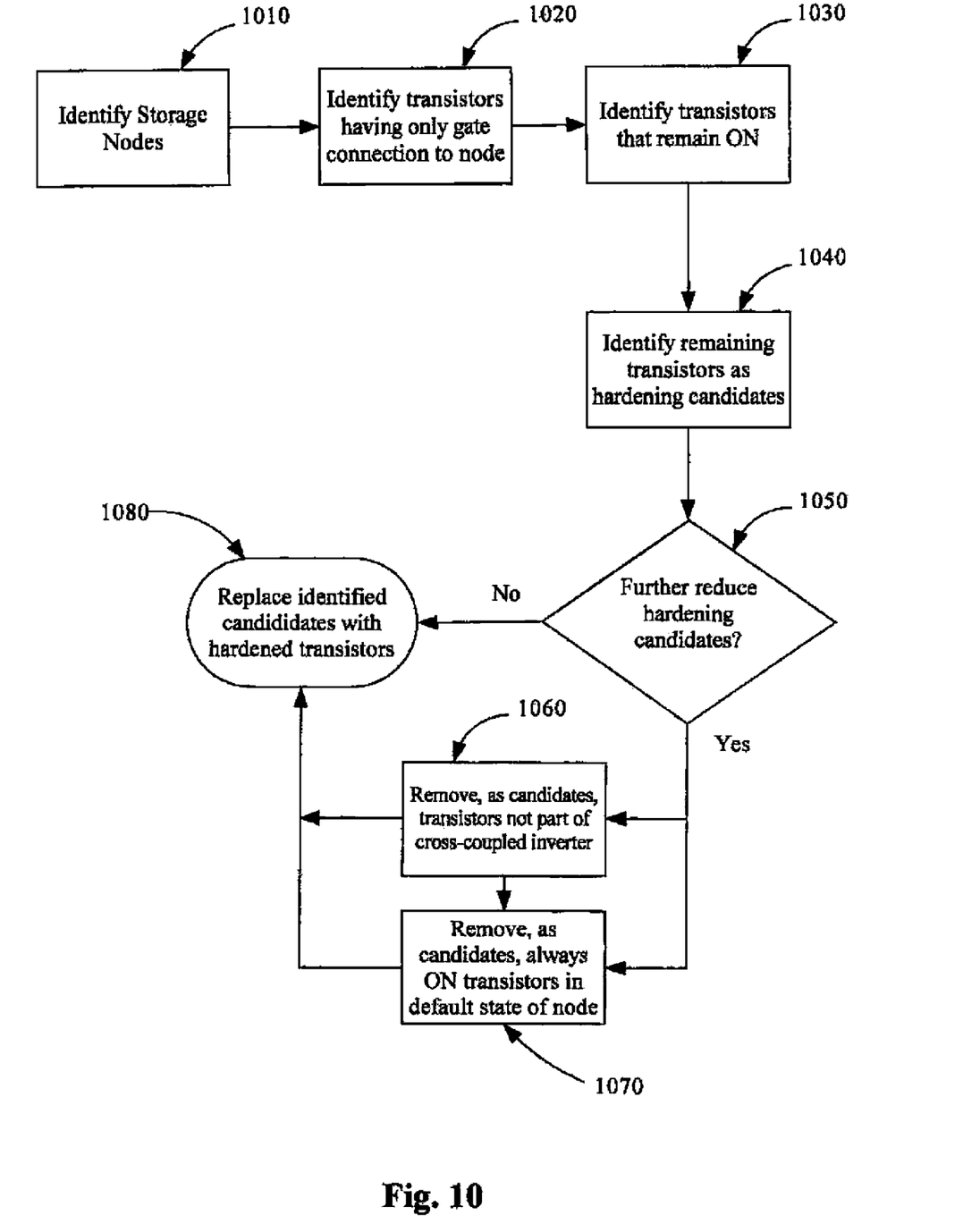
FIG. 10 is a flow chart illustrating a method of selecting transistors within a particular circuit to be replaced with SEU-hardened, series FETs in accordance with the inventive arrangements.

Referring to FIG. 10, a method to select transistors (or transistor nodes) within a particular circuit to be replaced with SEU hardened, series transistors is disclosed. As the term is used herein, an SEU-susceptible transistor is a particular transistor, which if not hardened, would be SEU-susceptible. In step 1010, the storage nodes of a latch, which requires hardening against SEU, are identified. Circuit designers skilled in art of latch design know what nodes in the latch are used to store data. For example, in dynamic latches, one such storage node typically exists per latch. In static latches, two such storage nodes exist per latch. FIG. 1 illustrates a typical static latch, and nodes "true" and "comp" are the two nodes used to store data. Although the method and apparatus described herein are in relation to the latch illustrated in FIG. 1, the described method and apparatus are not limited in this manner. As recognized by those skilled in the art, many different types of latch/configurations, both yet to be designed and currently existing, can benefit from the methods and apparatus described herein.

In step 1020, transistors that have only a gate terminal connection to either of these storage nodes (i.e., "true" and "comp") are identified. These gate-connected transistors cannot be the cause of SEU, and thus, those transistors that have only a gate terminal connection to either of the storage nodes can be excluded as a candidate for hardening using the series FET. In FIG. 1, for example, transistors 109, 110 each have only a gate terminal connection to a storage node, (i.e., "true"). Thus, transistors 109, 110 do not require hardening using the series FET.

In step 1030, A third step is to analyze the remaining transistors under the condition of (1) latch holding its state and storage node at logic state 0 and (2) latch holding its state and storage node at logic state 1. For the latch of FIG. 1, the condition (1) occurs when "clock"=0, "clock_not"=1, "true"=0, and "comp"=1, while the condition (2) occurs when "clock"=0, "clock_not"=1, "true"=1, and "comp"=0. Any FET which remains ON for both conditions (1) and (2) is not susceptible to SEU. In FIG. 1, for example, FETs 104, 105 meet both of the above-identified conditions. Thus, FETs 104, 105 do not require hardening using the series FET.

After steps 1-3 are applied to a device to be analyzed (e.g., the latch 100 of FIG. 1) and those FETs that do not have to be hardened are identified, the FETs that remain are the FETs that are susceptible to SEU and are identified as candidates for hardening. For example, referring to FIG. 4, out of the ten FETs illustrated in FIG. 1, there are six FETs that are candidates to be replaced with the series transistors.

Figure 8:
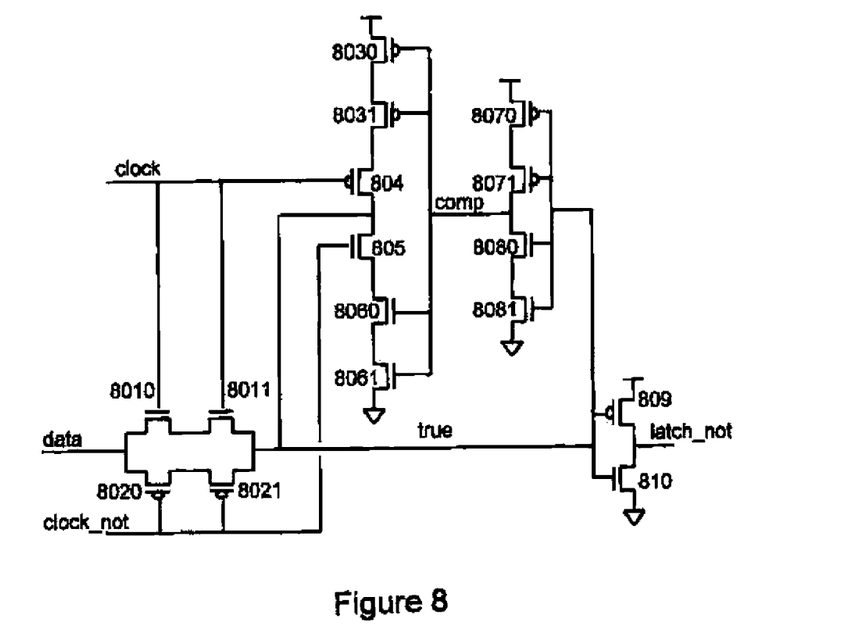
FIG. 8 illustrates yet another SEU-hardened latch in which both the cross-coupled inverters and write FETs have been SEU-hardened in accordance with the inventive arrangements.

In step 1040, a designer decides which FETs of the SEU-susceptible FETs are to be replaced by the series FETs. As already described, each time a single FET is replaced by a series FET, the design incurs overhead in terms of area, delay, and power. In step 1080, the designer may choose to harden all of the SEU-susceptible FETs. For example, referring to FIG. 4, a designer may choose to harden all six transistors. FIG. 8 illustrates a configuration in which all six transistors identified in FIG. 4 as being SEU-susceptible are converted into series FETs.

However, in step 1050, the designer may make a determination that by replacing only a subset of SEU-susceptible FETs, the failure rate of a given latch resulting from SEU will be reduced below an acceptable level. By replacing only a subset of SEU-susceptible FETs, instead of replacing all of the FETs, the amount of overhead incurred to the design, in terms of area, delay, and/or power, may be reduced. Although the method is not limited to these particular steps, certain possible selection techniques for selecting a subset of SEU-susceptible FETs are described below as steps 1060 and 1070. Despite the description of steps 1060 and 1070 being separately performed, the method is not limited in this manner. For example, steps 1060 and 1070 (and/or other selection techniques) can be performed together to select the subset of SEU-susceptible FETs to be replaced.

Figure 4:
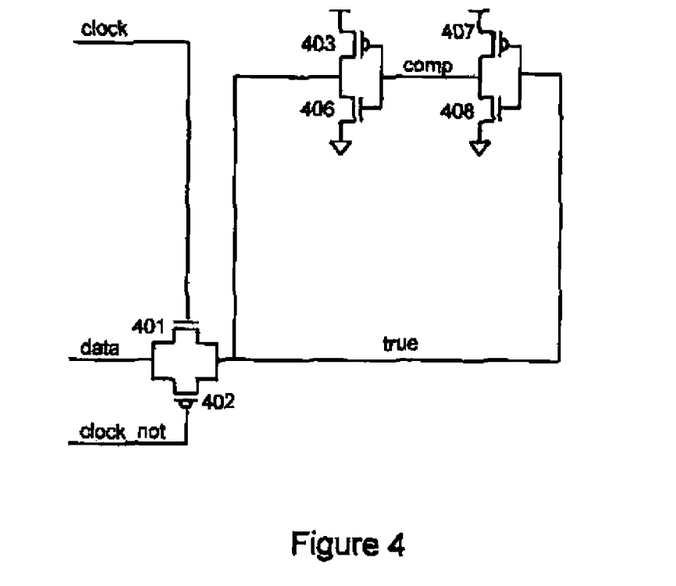
FIG. 4 illustrates SEU-susceptible FETs in the latch of FIG. 1.
Figure 5:
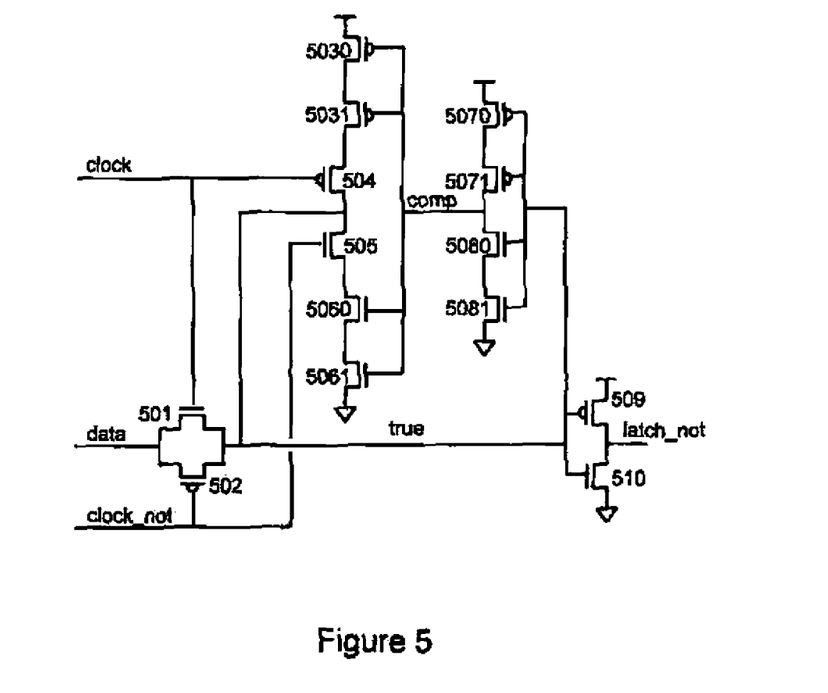
FIG. 5 illustrates a SEU-hardened latch, in accordance with the inventive arrangements, in which only the cross-coupled inverters have been SEU-hardened.

In step 1060, as shown in FIG. 5, one selection technique for identifying a subset of SEU-susceptible FETs to be replaced is to only select FETs that are part of a cross-coupled inverter (e.g., 403/406 and 407/408 of FIG. 4). An advantage of this technique is that clock nets "clock" and "clock_not" still drive a single FET. Since AC power from clock nets is one of the major consumers of power, the implementation illustrated in FIG. 5 does not increase required clock power. Additionally, with the latch of FIG. 5, the critical latch delay is from node "data" through the transmission gate formed by FETs 501/502 to node "true," and from node "true" through the inverter formed by FETs 509/510 to latch output node "latch_not." The series FETs are slower then the single FET being replaced. However, the resultant configuration in FIG. 5 does not place any series FETs in this delay-critical path, and thus, the latch delay does not increase.

With only cross coupled inverters being hardened, the latch is still susceptible to SEU. For example, upon the latch holding state 1 such that "clock"=0, "clock_not"=1, "true"=1, and "comp"=0, if high energy particles hits transistor 501, a chance exists that the latch state will be lost. If "data"=0, then the latch may be written to "true"=0 state. Conversely, if "data"=1, then the latch will keep a proper state despite being hit from a high energy particle.

Figure 6:
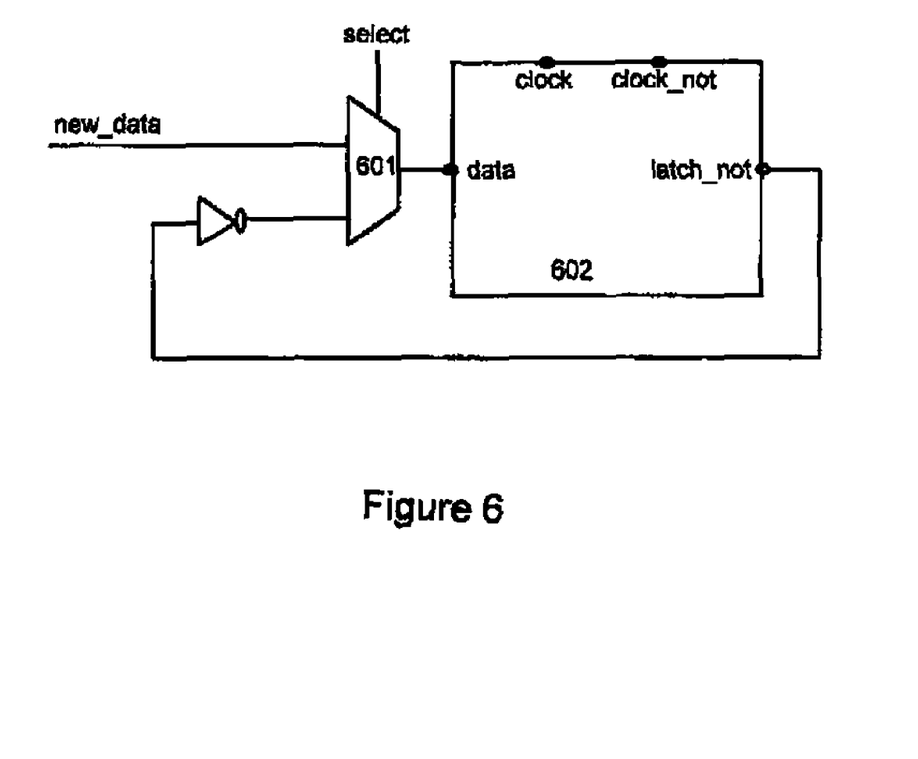
FIG. 6 illustrates another SEU-hardened latch, in accordance with the inventive arrangements, in which write transistors of the latch have been SEU-hardened via the use of a hold multiplexer.

In many designs, however, the protection provided by series FETs in the cross-coupled inverters alone may be sufficient to meet design goals. Such a design can avoid the delay/power penalty that occurs if FETs 501, 502 were also replaced by series FETs. Since the effectiveness of the implementation show in FIG. 5 increases as the state of "data" node equals the state of "true" node, the configuration of FIG. 6 illustrates that by placing a multiplexer circuit in front of the latch and directing "latch_not" output back to "data" input upon "clock"=0 and "clock_not"=1, this configuration will fully harden the latch against SEU even if FETs 501 or 502 of FIG. 5 are hit by high energy particles. Thus, by employing the configuration of FIG. 6, the FETs 501, 502 of FIG. 5 are not required to be hardened. In this regard, it is noted that FIG. 6 only conceptually illustrates how the latch may be hardened. As recognized by those skilled in the art of circuit design, many different ways exist to implement the techniques described herein with other circuit elements.

Figure 7:
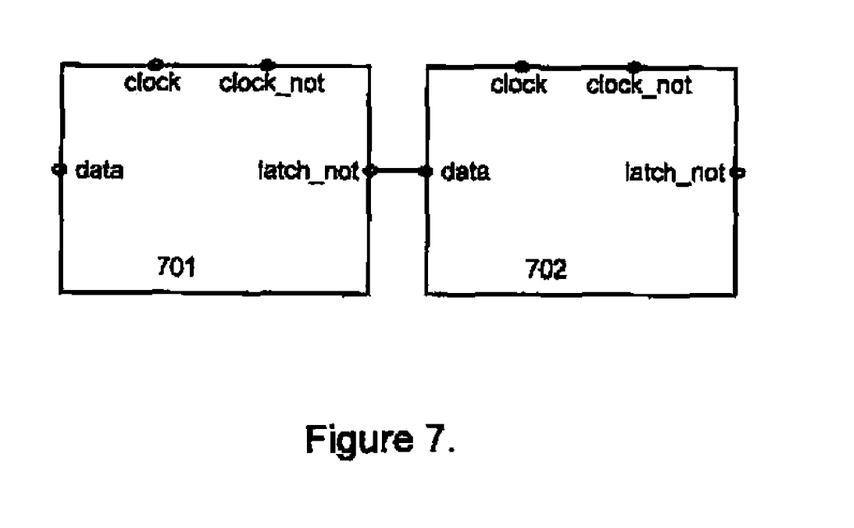
FIG. 7 illustrates a master-slave SEU-hardened latch in accordance with the inventive arrangements.

FIG. 7 illustrates another technique for protecting, from SEU, write transistors in a latch that only has hardened cross-coupled inverters. This technique involves using a master 701-slave 702 configuration. The clocks are designed such that in a hold state both master 701/slave 702 "clock"=0 and the master 701/slave 702 "clock_not"=1. As such, the master latch holds the same data as the slave latch. The slave latch may then be hardened (e.g., using the configuration illustrated in FIG. 5). In so doing, even if high energy particle hits FETs 501 or 502 (see FIG. 5) in the slave latch, the slave latch will be re-written with the correct data from the master latch. Thus, by employing the configuration of FIG. 7, the FETs 501, 502 of FIG. 5. are not required to be hardened.

Figure 9:
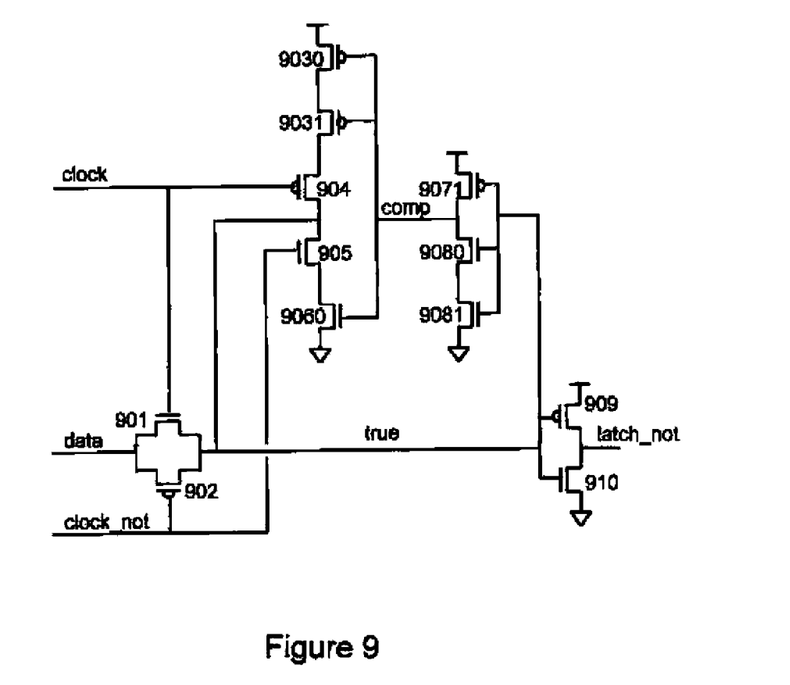
FIG. 9 illustrates still another SEU-hardened latch in which only the cross-coupled inverters have been SEU-hardened and a preferred state of the latch is "true"=0 in accordance with the inventive arrangements.

As shown in FIG. 9, another selection technique for identifying a subset of SEU-susceptible FETs to be replaced is disclosed. In certain circumstances, a designer may know that certain latch or latches are more likely to be storing 0 logic state or 1 logic state. For example, certain configurations of latches are designed to default to logic state 0, and only in infrequent situations are these latches driven to logic state 1. In step 1070, certain transistors are removed as candidates for hardening because they are always ON. For example, if "true" has a very high probability of being 0, then pFET 9071 has a very high probability of being ON. Similarly, if "true"=0, then "comp"=1, the nFET 9060 also has a very high probability on being ON. In this situation, the cost/benefit ratio of hardening FETs 9071, 9060 may be too high; and thus, these FETs may be removed as candidates for hardening. In so doing, the area, power, delay overhead for the latch can be reduced.

Similarly, a determination may be made as to the likelihood that the node "data" is opposite the node "true." If the determination yields a low likelihood that the node "data" is opposite the node "true," then the likelihood is also low that even if FETs 901 or 902 were turned ON, then the latch would be written to the incorrect state. In this situation, the cost/benefit ratio of hardening FETs 901, 902 may also be too high; and thus, these FETs may also be removed as candidates for hardening. This circumstance may occur, for example, in static circuits in which data switches very infrequently.

What is claimed is:

1. A method of determining one or more transistors within a particular latch to be respectively replaced with a hardened, series transistor, comprising:

identifying, as not requiring hardening, each transistor having only a gate terminal connected to a storage node of the latch;

identifying, as not requiring hardening, each transistor that remains ON upon both of the latch holding its state, and a respective storage node at logic state 0, and the latch holding its state, and the respective storage node at logic state 1;

identifying, as candidates for hardening, each transistor not previously identified as not requiring hardening; and employing a hardened, series transistor in place of a transistor identified as a candidate for hardening.

2. The method of claim 1, wherein the series transistor includes first and second series-connected transistors having a shared source/drain region and a drain of the first series-connected transistor is merged with a source of the second series-connected transistor.

3. The method of claim 1, wherein the candidates for hardening only include transistors being part of a cross-coupled inverter of the latch.

4. The method of claim 1, wherein a threshold voltage of the hardened, series transistor is lower than a threshold voltage of the transistor identified as a candidate for hardening.

* * * * *